United States Patent [19]

Grewal et al.

[11] Patent Number: 5,262,002
[45] Date of Patent: Nov. 16, 1993

[54] METHOD FOR MANUFACTURING A TRENCH STRUCTURE IN A SUBSTRATE

[75] Inventors: Virinder-Singh Grewal, Ebersberg; Siegfried Schwarzl, Neubiberg, both of Fed. Rep. of Germany

[73] Assignee: Siemens Aktiengesellschaft, Munich, Fed. Rep. of Germany

[21] Appl. No.: 955,464

[22] Filed: Oct. 2, 1992

[30] Foreign Application Priority Data

Oct. 2, 1991 [DE] Fed. Rep. of Germany ....... 4132836

[51] Int. Cl.$^5$ .......................................... H01L 21/312
[52] U.S. Cl. .................................. 156/657; 156/662; 437/67; 437/52; 148/DIG. 50
[58] Field of Search .................. 156/657, 662; 437/67, 437/63, 72; 148/DIG. 50, DIG. 51

[56] References Cited

U.S. PATENT DOCUMENTS

| | | | |
|---|---|---|---|
| 4,604,162 | 8/1986 | Sobczak | 156/657 |
| 4,784,720 | 11/1988 | Douglas | 156/657 |
| 4,845,048 | 7/1989 | Tamaki et al. | 437/67 |
| 4,894,695 | 1/1990 | Ishii et al. | 437/67 |
| 4,967,247 | 10/1990 | Kaga et al. | |
| 5,013,679 | 5/1991 | Kumagai et al. | 437/52 |
| 5,047,815 | 9/1991 | Yasuhira et al. | |
| 5,072,269 | 12/1991 | Hieda | |
| 5,106,775 | 4/1992 | Kaga et al. | 437/52 |

FOREIGN PATENT DOCUMENTS

| | | |
|---|---|---|
| 0201706 | 11/1986 | European Pat. Off. |
| 0333426 | 9/1989 | European Pat. Off. |
| 3841588 | 6/1989 | Fed. Rep. of Germany |
| 63-115367 | 5/1988 | Japan |
| 1-287956 | 11/1989 | Japan |
| 2-100357 | 4/1990 | Japan |

OTHER PUBLICATIONS

15th Annual Tegal Plasma Seminar, 1989 "Single Crystal Silicon Etching in a Tri-Electrode Etcher Using CBrF$_3$ Chemistry", Manfred Engelhardt, Siemens AG, Corporate Research and Development and Microelectronics.

9th International Symposium on Plasma Chemistry Pugnochiuso, Italy 1989 "Anisotropic Etching of Silicon in Magnetic Field Enhanced Plasma" V. Grewal et al, Siemens AG Corporate Research and Development, Development Laboratory for Process Technology.

Symposium on Dry Process, of Electrochem. Soc. Proc., vol. 88-7, 1988 "Submicron Trench Etching Under High Pressure (60 Pa)", Hirofumi Uchida et al, Kyoto Research Laboratory Matsushita Electronics Corporation.

*Primary Examiner*—Brian E. Hearn
*Assistant Examiner*—Trung Dang
*Attorney, Agent, or Firm*—Hill, Steadman & Simpson

[57] ABSTRACT

A trench mask containing SiO$_2$ is produced on a substrate (1) of single-crystal silicon. After deposition of a first Si$_3$N$_4$ layer, first Si$_3$N$_4$ spacers (31) are formed by anisotropic etching, and a first trench is etched to a first depth (t$_1$). After selective removal of passivation layers arising in the first trench etching and after deposition of a second Si$_3$N$_4$ layer, second Si$_3$N$_4$ spacers (41) are formed by anisotropic etching. A second trench is etched to a second depth (t$_2$), whereby the trench structure (5) is formed to a total depth (t$_1$ and t$_2$).

13 Claims, 2 Drawing Sheets

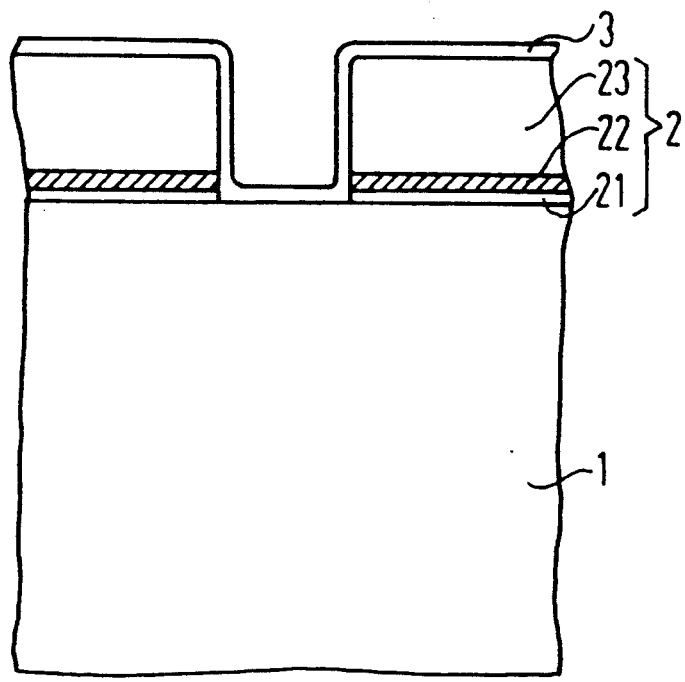
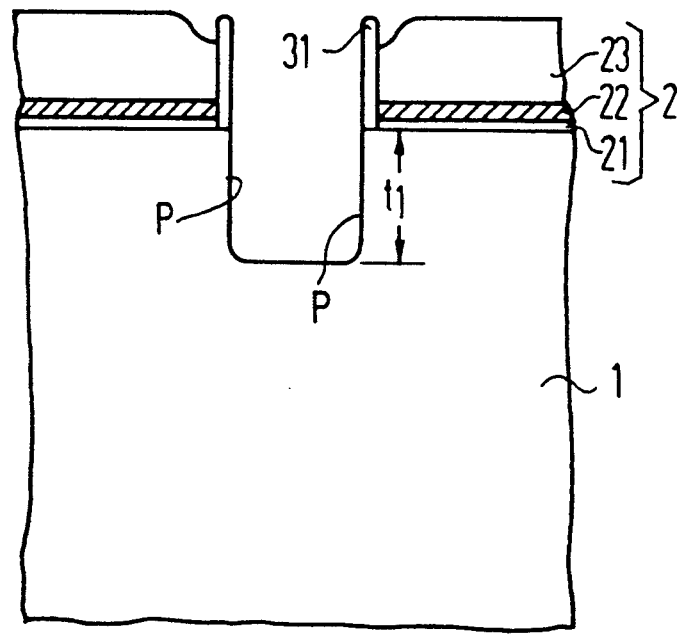

METHOD FOR MANUFACTURING A TRENCH STRUCTURE IN A SUBSTRATE

BACKGROUND OF THE INVENTION

Within the framework of progressive miniaturization of integrated circuits, trench structures are being utilized to an ever greater extent in silicon substrates for enlarging the usable surface. Trench structures for creating storage capacitors or for accepting transistors are particularly utilized in DRAM storage or memory circuits. It is important in operation that these trench structures have well-defined edges at the surface of the substrate. Defined initial structures are required at the surface of the substrate particularly for producing contacts between a storage capacitor arranged in the trench structure and a selection transistor, or for producing transistors in the trench structure.

Trench etching processes for manufacturing trench structures are known (see H. Uchida et al. Proc. of the Symp. on Dry Process J. Electrochem. Soc. Proc. Vol. 88-7, 55 (1988); M. Engelhardt Proc. 15th Annual Tegal, Plasma Seminar, 53 (1989); V. Grewal et al., 9th International Symposium on Plasma Chemistry Pugnochiuso, Italy, 1989, pp. 585-ff) wherein oxide layers are employed as an etching mask. The trench etching processes for producing trench structures having perpendicular and smooth trench walls are controlled such that passivation layers are formed at arising side walls of the trench structures during the trench etching. These passivation layers have an oxide-like composition.

The passivation layers are removed with an oxide etchant after the trench etching. The oxide etchant also attacks the etching mask. The etching mask is partially etched off and set back at the neck of the trench. The trench walls in the region of the silicon surface are therefore attacked in further etching processes, for example for deepening the trench. Since the shape of the etching mask at the trench neck was modified, a modified etching attack in the upper region of the trench ensues. The trench walls in the upper region of the trench will no longer be perpendicular in this way. This leads to problems in operation and/or performance.

SUMMARY OF THE INVENTION

The object of the invention is to specify a method for manufacturing a trench structure in a substrate, the trench structures manufactured having a defined geometry in the region of the substrate surface. In particular, the method should be suitable for producing trench structures that are occupied in their upper region with spacers (side wall coverings) down into a defined depth.

The problem is inventively resolved by a method whereby a trench mask is produced on the substrate of a single-crystal silicon, the trench mask comprising $SiO_2$ at least at the surface and resisting an etching process for generating the trench structure, whereby first $Si_3N_4$ spacers are produced at the vertical sidewalls of the trench mask by deposition and anisotropic etching of a first $Si_3N_4$ layer, whereby a first trench etching into the substrate is undertaken in a first depth in an anisotropic etching process selectively vis-a-vis $SiO_2$, whereby oxide-like passivation layers form at side walls of the arising trench structure, whereby the oxide-like passivation layers are selectively removed with respect to $Si_3N_4$ and silicon, whereby second $Si_3N_4$ spacers are formed at the side walls of the arising trench structure by deposition and anisotropic re-etching of a second $Si_3N_4$ layer, whereby a second trench etching in a second depth is undertaken into the substrate in an anisotropic etching process selectively with respect to $SiO_2$, with which second trench etching the trench structure is finished in a depth corresponding to the sum of the first depth and the second depth.

As a result of producing the first $Si_3N_4$ spacers (side wall coverings) at the perpendicular side walls of the trench mask before the first trench etching, the vertical side walls of the trench mask are protected against an etching attack during the removal of the oxide-like passivation layers following the first trench etching. Second $Si_3N_4$ spacers are formed at the side walls of the arising trench structure after the first trench etching. These protect the side walls of the trench structure in the upper region that was produced by the first trench etching against an etching attack in the removal of passivation layers formed in the second trench etching or against oxidation in the formation of a $SiO_2$ layer on the surface of the trench structure. A trench structure is produced in this way that has a defined geometry in its upper region, i.e., in the region that is produced by the first trench etching. The second $Si_3N_4$ spacers cover the trench structure in the region produced in the first trench etching. The depth of the trench structure in which the side walls of the trench structure are occupied with the second $Si_3N_4$ spacer is therefore set via the first depth of the first trench etching. The expanse of the second $Si_3N_4$ spacers can therefore be set via the first depth of the first trench etching.

It lies within the framework of the invention to implement the production of the first $Si_3N_4$ spacers and the first trench etching as well as the production of the second $Si_3N_4$ spacers and the second trench etching in a respective anisotropic etching process. Process steps are thereby eliminated.

It is especially advantageous to implement a process step upon employment of dummy wafers for cleaning the reaction chamber before the anisotropic trench etching. Contamination of the trench structure is thereby avoided.

The plasma parameters are selected for chamber cleaning such that an incipient etching of the dummy wafers cannot occur without the chamber walls being cleaned.

The dummy wafers are $SiO_2$-coated silicon wafers or $Al_2O_3$ wafers that can be repeatedly employed.

This cleaning step is undertaken before every trench etching, so that every process wafer encounters constant chamber conditions.

For example, the following parameters are employed for the chamber cleaning:

$NF_3$ flow, 50 through 80 sccm chamber pressure, 100 through 200 mTorr (13 through 27 Pa)

R.F. Power 100 through 300 Watt

D.C. bias, 10 volts magnetic flux density, 60 through 100 G ($60 \times 10^{-4}$ through $100 \times 10^{-3}$ T), etching time, approximately 1 minute It particularly lies within the framework of the invention to selectively remove passivation layers arising in the second trench etching vis-a-vis $Si_3N_4$ and silicon after the second trench etching. Subsequently, a $SiO_2$ layer is formed at the exposed silicon surface of the trench structure, i.e. in the region of the second trench etching. When the SiO$_2$ layer is produced by thermal oxidation of the surface, a bird's beak is formed at the boundary line with the second Si$_3$N$_4$ spacer. The employment of the method of the invention can thereby be easily recognized.

Further developments of the invention are presented whereby the trench mask is produced of a SiO$_2$ layer on the substrate, and of a Si$_3$N$_4$ layer on the SiO$_2$ layer and of a SiO$_2$ layer formed by thermal decomposition of Si(OC$_2$H$_5$)$_4$ that has thickness in a range from 400 nm through 1000 nm. Additionally, the first Si$_3$N$_4$ layer and the second Si$_3$N$_4$ layer can be deposited in a thickness in the range from 20 nm through 100 nm. Also, the method can be such that the first depth of the first trench etching amounts to 0.5$\mu$ through 3 $\mu$m and the second depth of the second trench etching amounts to 3 through 10 $\mu$m. Additionally, the production of the first Si$_3$N$_4$ spacers and the first trench etching can ensue in the same anisotropic etching process. The production of the second Si$_3$N$_4$ spacers and the second trench etching can ensue in the same anisotropic etching process. Also, oxide-like passivation layers formed in the second trench etching can be removed after the second trench etching selectively, with respect to Si$_3$N$_4$ and silicon. A SiO$_2$ layer can be formed at the surface of the trench structure, self-aligned with respect to the first Si$_3$N$_4$ spacers and with respect to the second Si$_3$N$_4$ spacers. The oxide-like passivation layers can be removed by HF vapor or wet-chemically.

BRIEF DESCRIPTION OF THE DRAWINGS

The invention shall be set forth in greater detail below with reference to an exemplary embodiment and the figures.

FIG. 1 is a sectional view of a silicon substrate with a trench mask that is covered with a Si$_3$N$_4$ layer.

FIG. 2 is a sectional view of the silicon substrate of FIG. 1 after the first trench etching.

DETAILED DESCRIPTION OF THE PREFERRED EMBODIMENTS

Figure 3:
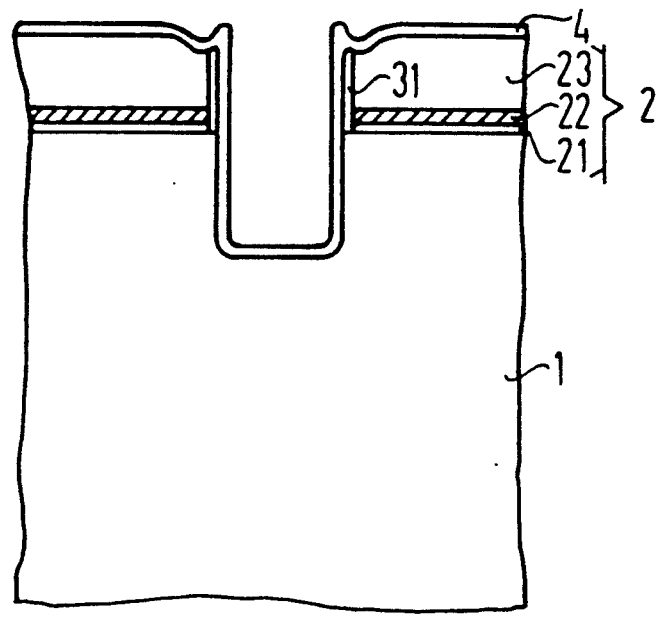
FIG. 3 is a sectional view of the silicon substrate after deposition of the second Si$_3$N$_4$ layer.

A trench mask 2 is produced on a substrate 1 of single-crystal silicon (see FIG. 1). The trench mask 2 comprises a thin SiO$_2$ layer 21 that is arranged on the surface of the substrate 1. The thin SiO$_2$ layer 21 has a thickness of, for example, 20 nm. A Si$_3$N$_4$ layer 22 having a thickness of, for example, 40 nm is arranged on the thin SiO$_2$ layer. A SiO$_2$ layer 23 is arranged on the Si$_3$N$_4$ layer 22. The SiO$_2$ layer 23 is produced by CVD deposition after thermal decomposition of Si(OC$_2$H$_5$)$_4$ in what is referred to as a TEOS process. The SiO$_2$ layer 23 is produced in a thickness of, for example, 400 through 1000 nm, preferably 600 nm. The trench mask 2 defines the region for the trench structure at the surface of the substrate 1 on the basis of common, vertical sidewalls of the thin SiO$_2$ layer 21, of the Si$_3$N$_4$ layer 22 and of the SiO$_2$ layer 23.

A first Si$_3$N$_4$ layer 3 is deposited surface-wide on the substrate 1 with the trench mask 2. The first Si$_3$N$_4$ layer 3 has a thickness of, for example, 20 through 100 nm, preferably 20 through 40 nm. The first Si$_3$N$_4$ layer 3 covers the trench mask 2 both at the surface of the SiO$_2$ layer 23 as well as at the vertical side walls. Further, the first Si$_3$N$_4$ layer 3 covers the exposed surface of the substrate 1.

The surface of the SiO$_2$ layer 23 and of the substrate 1 is exposed in an anisotropic etching process. First Si$_3$N$_4$ spacers 31 are thereby formed from the first Si$_3$N$_4$ layer 3. The anisotropic etching process is continued, whereby a first trench etching into the substrate 1 ensues. The trench mask 2, including the SiO$_2$ layer 23, is not attacked by the anisotropic etching process. Vertical walls arise in the first trench etching process. A deposition of passivation layers P arises at the vertical walls.

These passivation layers are oxide-like and are removed selectively without removal of Si$_3$N$_4$ and silicon to any substantial extent. The passivation layers, for example, are removed by HF vapor (Excalibur) or wet-chemically. Any etchant that attacks SiO$_2$ but does not attack Si$_3$N$_4$ and silicon is suitable for wet-chemical removal. Approximately 100 through 150 nm of the layer thickness of the SiO$_2$ layer 23 are thereby etched off. The first Si$_3$N$_4$ spacers 31 are not attacked. (see FIG. 2). The first trench etching ensues into a depth t$_1$ of, for example, 2 $\mu$m.

The following process is particularly suitable as anisotropic process:

HBr flow: 10 through 60 sccm
NF$_3$ flow: 2 through 8 sccm
He flow: 5 through 40 sccm
O$_2$ flow: 0.5 through 3 sccm
chamber pressure: 100 mTorr (13 Pa)
magnetic flux density: 70 through 120 G ($70 \times 10^{-4}$ through $120 \times 10^{-4}$ T)
RF power: 400 through 600 Watts.

The etching time is dependent on the desired trench depth.

After a cleaning step, a second Si$_3$N$_4$ layer 4 is deposited surface-wide. The second Si$_3$N$_4$ layer 4 is deposited in a thickness of, for example, 20 through 100 nm, preferably 20 through 40 nm. The second Si$_3$N$_4$ layer completely covers the surface of the SiO$_2$ layer 23, of the first Si$_3$N$_4$ spacer 31 and the surface of the substrate 1 exposed in the region of the first trench etching (see FIG. 3).

The second Si$_3$N$_4$ layer 4 is removed in the region of the surface of the SiO$_2$ layer 23 and of the surface of the floor of the first trench etching in another anisotropic etching process. Second Si$_3$N$_4$ spacers 41 thereby arise (see FIG. 4). The vertical side walls that arose in the first trench etching are completely covered by the second Si$_3$N$_4$ spacers 41. The anisotropic etching process is continued, so that a second trench etching into the substrate 1 ensues. Vertical side walls again arise in the second trench etching. Passivation layers P are deposited at these vertical side walls in the second trench etching. The second trench etching is etched down into a depth t$_2$ of, for example, 5 $\mu$m. A trench structure 5 is thereby finished that—from the surface of the substrate 1 down to trench floor—has a depth corresponding to the sum of the first depth t$_1$ and of the second depth t$_2$: t$_1$+t$_2$. The passivation layers that were deposited in the second trench etching are again selectively removed without removal of Si$_3$N$_4$ and silicon to any substantial extent.

Figure 4:
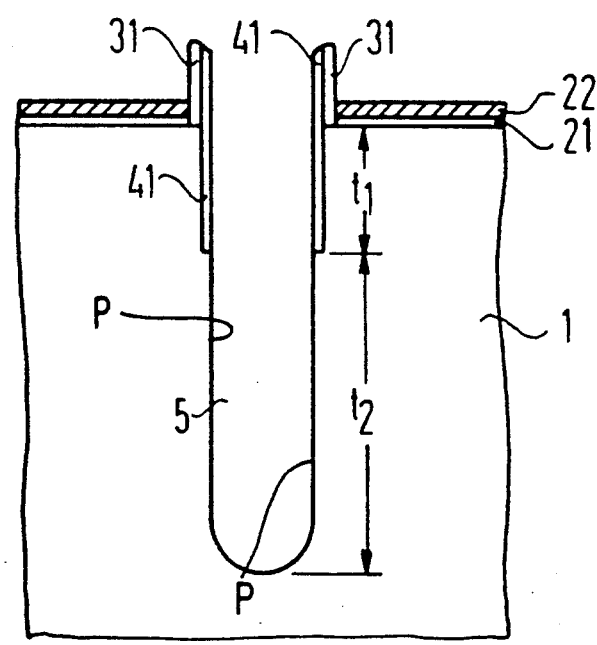
FIG. 4 is a sectional view of the silicon substrate after the second trench etching.

As shown in FIG. 4, it lies within the framework of the invention to simultaneously remove the SiO$_2$ layer 23.

The finished trench structure 5 comprises vertical side walls that are covered with the second Si$_3$N$_4$ spacers 41 down to the first depth $t_1$. The first depth $t_1$ can thereby be set via the first trench etching. It lies within the framework of the invention to continue the process with an oxidation step, wherein the exposed surface of the substrate 1 is provided with a $SiO_2$ layer in the region of the trench structure 5. The second $Si_3N_4$ spacers 41 thereby act as oxidation mask.

Essentially the same parameters as employed for the first spacer and trench etching can be employed for the anisotropic etching process for producing the second $Si_3N_4$ spacers 41 and the second trench etching.

Although the present invention has been described with reference to a specific embodiment, those of skill in the art will recognize that changes may be made thereto without departing from the scope and spirit of the invention as set forth in the appended claims.

We claim as our invention:

1. A method for manufacturing a trench structure in a substrate of single-crystal silicon, comprising the steps of:
    producing a trench mask on a surface of the substrate, said trench mask comprising $SiO_2$ at least at the surface;
    producing first $Si_3N_4$ spacers at the vertical side walls of the trench mask by deposition and anisotropic etching of a first $Si_3N_4$ layer;
    etching a first trench into the substrate to a first depth in an anisotropic etching process selectively without removal of $SiO_2$ to any substantial extent, whereby oxide-like passivation layers form at side walls of the arising trench structure;
    selectively removing the oxide-like passivation layers without removal of $Si_3N_4$ and silicon to any substantial extent;
    forming second $Si_3N_4$ spacers at the side walls of the arising trench structure by deposition and anisotropic etching of a second $Si_3N_4$ layer; and
    etching a second trench to a second depth into the substrate in an anisotropic etching process selectively without removal of $SiO_2$ to any substantial extent, said second trench etching the trench structure to a total depth corresponding to the sum of the first depth and the second depth.

2. The method according to claim 1, wherein the step of producing the trench mask comprises the steps of producing a $SiO_2$ layer on the substrate, producing a $Si_3N_4$ layer on the $SiO_2$ layer, and forming a second $SiO_2$ layer on the $Si_3N_4$ layer, by thermal decomposition of $Si(OC_2H_5)_4$ that has thickness in the range from 400 nm through 1000 nm.

3. The method according to claim 1, wherein the first $Si_3N_4$ layer and the second $SI_3N_4$ layer are deposited in a thickness in the range from 20 nm through 100 nm.

4. The method according to claim 1, wherein the first depth of the first trench etching amounts to $0.5\mu$ through 3 $\mu m$ and the second depth of the second trench etching amounts to 3 through 10 $\mu m$.

5. The method according to claim 1, wherein the production of the first $Si_3N_4$ spacers and the first trench etching ensue in the same anisotropic etching process.

6. The method according to claim 1, wherein the production of the second $Si_3N_4$ spacers and the second trench etching ensue in the same anisotropic etching process.

7. The method according to claim 1, wherein oxide-like passivation layers formed in the second trench etching are removed selectively without removal of $Si_3N_4$ and silicon to any substantial extent after the second trench etching.

8. The method according to claim 1, wherein a $SiO_2$ layer is formed at the surface of the trench structure self-aligned with respect to the first $Si_3N_4$ spacers and with respect to the second $Si_3N_4$ spacers.

9. The method according to claim 1, wherein the oxide-like passivation layers are removed by HF vapor.

10. The method according to claim 1, wherein the oxide-like passivation layers are removed wet-chemically.

11. A method for forming a trench into a single-crystal silicon substrate, having well-defined edges at a surface of the substrate, comprising the steps of:
    applying a trench mask onto the surface of the substrate, the trench mask comprising $SiO_2$ and providing an open area arranged at the site of the trench structure;
    depositing a first $Si_3N_4$ layer onto said mask and also onto said substrate within said open area;
    anisotropically etching said first $Si_3N_4$ layer to remove portions of said first $Si_3N_4$ layer which overlies said mask and said substrate leaving first $Si_3N_4$ spacers at the vertical side walls of the open area;
    anisotropically etching a first trench into the substrate to a first depth without attacking $SiO_2$, whereby oxide-like passivation layers form at side walls of said first trench in said substrate;
    selectively removing the oxide-like passivation layers without attacking said first $Si_3N_4$ spacers or said silicon substrate;
    depositing a second $Si_3N_4$ layer onto said trench mask, onto said first $Si_3N_4$ spacers, and onto said side walls of said trench structure;
    anisotropically etching said second $Si_3N_4$ layer to form second $Si_3N_4$ spacers on said side walls of said trench structure;
    anisotropically etching a second trench to a second depth into said substrate without attacking $SiO_2$, said second trench etching said substrate to a total depth corresponding to the sum of the first depth and the second depth.

12. The method according to claim 11 comprising the further step of removing said oxide-like passivation layers formed in said second trench etching without attacking $Si_3N_4$ or silicon.

13. The method according to claim 12, wherein said step of producing said trench mask comprises the steps of producing a $SiO_2$ layer on the substrate, producing a $Si_3N_4$ layer on the $SiO_2$ layer, and forming a second $SiO_2$ layer on the $Si_3N_4$ layer; and
    said second $SiO_2$ layer is removed during removal of said passivation layers formed in said second trench etching.

* * * * *